(12) United States Patent
Zhao et al.

(10) Patent No.: US 12,033,571 B2
(45) Date of Patent: Jul. 9, 2024

(54) ARRAY SUBSTRATE, DISPLAY PANEL, SPLICED DISPLAY PANEL AND DISPLAY DRIVING METHOD

(71) Applicant: BOE TECHNOLOGY GROUP CO., LTD., Beijing (CN)

(72) Inventors: Jiao Zhao, Beijing (CN); Li Xiao, Beijing (CN); Minghua Xuan, Beijing (CN); Haoliang Zheng, Beijing (CN); Dongni Liu, Beijing (CN); Jing Liu, Beijing (CN); Qi Qi, Beijing (CN); Zhenyu Zhang, Beijing (CN); Liang Chen, Beijing (CN); Hao Chen, Beijing (CN); Lijun Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/307,416

(22) Filed: Apr. 26, 2023

(65) Prior Publication Data
US 2023/0260453 A1    Aug. 17, 2023

Related U.S. Application Data

(63) Continuation of application No. 17/744,965, filed on May 16, 2022, now Pat. No. 11,688,336, which is a
(Continued)

(51) Int. Cl.
*G09G 3/32*    (2016.01)
*G11C 19/28*   (2006.01)
(Continued)

(52) U.S. Cl.
CPC .............. *G09G 3/32* (2013.01); *G11C 19/28* (2013.01); *H01L 25/0753* (2013.01);
(Continued)

(58) Field of Classification Search
CPC ...... G09G 3/32; G09G 3/3233; G09G 3/3266; G09G 2300/0439; G09G 2310/0297;
(Continued)

(56) References Cited

U.S. PATENT DOCUMENTS 10,199,398 B2    2/2019  Chen et al.
10,217,422 B2 *  2/2019  Li ......................... G09G 3/344
(Continued)

FOREIGN PATENT DOCUMENTS

CN    102810296 A    12/2012
CN    103325814 A     9/2013
(Continued)

OTHER PUBLICATIONS

Japanese Office Action (w/ English translation) for corresponding JP Application No. 2022-523472, dated Sep. 5, 2023, 8 pages.
(Continued)

*Primary Examiner* — Vinh T Lam
(74) *Attorney, Agent, or Firm* — Dority & Manning, P.A.

(57) ABSTRACT

An array substrate includes M pixel lines and N pixel circuit groups. The M pixel lines are disposed in a display area and arranged in a first direction. The N pixel circuit groups are arranged in the first direction. M is an integer greater than or equal to 2, and N is a positive integer less than M. A pixel circuit group of the N pixel circuit groups is electrically connected to adjacent two pixel lines of the M pixel lines, and the first direction is one of a row direction and a column direction.

20 Claims, 8 Drawing Sheets

Related U.S. Application Data continuation of application No. 16/976,858, filed as application No. PCT/CN2019/122210 on Nov. 29, 2019, now Pat. No. 11,373,584.

(51) Int. Cl.
| | | |
|---|---|---|
| *H01L 25/075* | (2006.01) | |
| *H01L 27/02* | (2006.01) | |
| *H01L 27/12* | (2006.01) | |
| *H01L 33/62* | (2010.01) | |

(52) U.S. Cl.
CPC ........ *H01L 27/0296* (2013.01); *H01L 27/124* (2013.01); *H01L 33/62* (2013.01); *G09G 2300/026* (2013.01); *G09G 2310/0286* (2013.01); *G09G 2330/04* (2013.01)

(58) Field of Classification Search
CPC ... G09G 2300/0408; G09G 2310/0286; G09G 2300/0426; G09G 2320/0223; G09G 2300/0413; G09G 2330/04; G09G 2300/026; H01L 25/167; H01L 33/62; H01L 27/1248; H01L 27/124; H01L 27/0296; H01L 25/0753; G11C 19/28
See application file for complete search history.

(56) References Cited

U.S. PATENT DOCUMENTS

| | | | |
|---|---|---|---|
| 10,311,779 B2 * | 6/2019 | Zhang | .......... H10K 59/179 |
| 10,468,397 B2 | 11/2019 | Cok | |
| 10,504,407 B2 | 12/2019 | Jang et al. | |
| 10,651,208 B2 | 5/2020 | Chen et al. | |
| 10,692,455 B2 | 6/2020 | Mitsuzawa et al. | |
| 10,762,823 B2 | 9/2020 | Xuan et al. | |
| 10,854,684 B2 | 12/2020 | Huangfu et al. | |
| 10,991,317 B2 | 4/2021 | Byun | |
| 11,081,539 B2 | 8/2021 | Liu et al. | |
| 11,200,847 B2 | 12/2021 | Xiong et al. | |
| 11,222,907 B2 | 1/2022 | Xi et al. | |
| 11,264,430 B2 | 3/2022 | Huangfu et al. | |
| 11,327,378 B2 | 5/2022 | Cheng et al. | |
| 11,373,584 B2 | 6/2022 | Zhao et al. | |
| 11,404,582 B2 | 8/2022 | Chen et al. | |
| 11,417,253 B2 | 8/2022 | Huang et al. | |
| 11,475,831 B2 | 10/2022 | Xuan et al. | |
| 11,508,298 B2 | 11/2022 | Chen et al. | |
| 11,568,821 B2 | 1/2023 | Zhang et al. | |
| 2006/0145964 A1 | 7/2006 | Park et al. | |
| 2009/0103002 A1 | 4/2009 | Enomoto | |
| 2009/0322649 A1 * | 12/2009 | Hamer | .......... G09G 3/2085 345/1.3 |
| 2012/0194773 A1 | 8/2012 | Kim et al. | |
| 2013/0321499 A1 | 12/2013 | Park et al. | |
| 2014/0361962 A1 | 12/2014 | Yamashita et al. | |
| 2016/0307517 A1 | 10/2016 | Park et al. | |
| 2018/0082630 A1 | 3/2018 | Kim et al. | |
| 2018/0190631 A1 | 7/2018 | Kim et al. | |
| 2018/0191978 A1 | 7/2018 | Cok et al. | |
| 2018/0323180 A1 * | 11/2018 | Cok | .......... H01L 23/5386 |
| 2018/0336864 A1 | 11/2018 | Wang et al. | |
| 2019/0074324 A1 | 3/2019 | Kim et al. | |
| 2019/0114954 A1 | 4/2019 | Xuan et al. | |
| 2019/0140030 A1 | 5/2019 | Huangfu et al. | |
| 2019/0304356 A1 | 10/2019 | Ka et al. | |
| 2019/0326751 A1 | 10/2019 | Xi | |
| 2020/0410941 A1 | 12/2020 | Park et al. | |
| 2021/0035521 A1 | 2/2021 | Qiu | |
| 2021/0056922 A1 | 2/2021 | Huang | |
| 2021/0057659 A1 | 2/2021 | Sun et al. | |
| 2021/0082962 A1 | 3/2021 | Cui | |
| 2021/0104192 A1 * | 4/2021 | Huang | .......... G09G 3/20 |
| 2021/0118366 A1 | 4/2021 | Xuan et al. | |
| 2021/0118370 A1 | 4/2021 | Shim et al. | |
| 2021/0118376 A1 | 4/2021 | Na | |
| 2021/0134223 A1 | 5/2021 | Li | |
| 2021/0181561 A1 | 6/2021 | Kawashima et al. | |
| 2021/0193067 A1 | 6/2021 | Shao et al. | |
| 2021/0208834 A1 | 7/2021 | Wang et al. | |
| 2021/0264849 A1 | 8/2021 | Suzuki | |
| 2021/0319748 A1 | 10/2021 | Chen et al. | |
| 2022/0277689 A1 | 9/2022 | Zhao et al. | |

FOREIGN PATENT DOCUMENTS

| | | | |
|---|---|---|---|
| CN | 105575330 A | | 5/2016 |
| CN | 106782416 A | | 5/2017 |
| EP | 2669884 A2 | | 12/2013 |
| EP | 3196941 A1 | | 7/2017 |
| EP | 3232431 A1 | | 10/2017 |
| EP | 3300116 A1 | | 3/2018 |
| JP | 2002091398 A | | 3/2002 |
| WO | WO 2018014562 A1 | | 1/2018 |
| WO | WO 2019037440 A1 | | 2/2019 |

OTHER PUBLICATIONS

Extended European Search Report for corresponding European Application No. 19945458.8, dated Oct. 24, 2022, 11 pages.

First Chinese Office Action (w/ English translation) for corresponding CN Application No. 201980002696.2, issued Mar. 30, 2022, 15 pages.

PCT International Search Report and Written Opinion (w/ English translation) for corresponding PCT Application No. PCT/CN2019/122210, mailed on Aug. 28, 2020, 18 pages.

Corrected Notice of Allowability for corresponding U.S. Appl. No. 16/976,858, dated Mar. 28, 2022, 4 pages.

Non-Final Office Action for corresponding U.S. Appl. No. 16/976,858, dated Oct. 25, 2021, 22 pages.

Notice of Allowance for corresponding U.S. Appl. No. 16/976,858, dated Feb. 16, 2022, 9 pages.

Notice of Allowance for corresponding U.S. Appl. No. 17/744,965, dated Mar. 7, 2023, 14 pages.

* cited by examiner

ARRAY SUBSTRATE, DISPLAY PANEL, SPLICED DISPLAY PANEL AND DISPLAY DRIVING METHOD

CROSS-REFERENCE TO RELATED APPLICATIONS

This application is a continuation of U.S. Ser. No. 17/744,965, filed on May 16, 2022, which is a continuation of U.S. Ser. No. 16/976,858, filed on Aug. 31, 2020, which claims priority to International Patent Application No. PCT/CN2019/122210, filed on Nov. 29, 2019, which are incorporated herein by reference in their entirety.

TECHNICAL FIELD

The present disclosure relates to the field of display technologies, and in particular, to an array substrate, a display panel, a spliced display panel and a display driving method.

BACKGROUND

With continuous development of display technologies, consumers have higher and higher performance requirements for display apparatuses in terms of screen size, bezel width, display brightness, display image quality, etc. For example, a display screen is required to have a larger screen size, a narrower bezel and a better uniformity of display brightness.

SUMMARY

In one aspect, an array substrate is provided. The array substrate has a display area; and the array substrate includes M pixel lines and N pixel circuit groups. The M pixel lines are disposed in the display area and arranged in a first direction, and the N pixel circuit groups are arranged in the first direction. M is an integer greater than or equal to 2, and N is a positive integer less than M. A pixel circuit group of the N pixel circuit groups is electrically connected to adjacent two pixel lines of the M pixel lines, and the first direction is one of a row direction and a column direction.

In some embodiments, a single pixel circuit group of the N pixel circuit groups is disposed between a (2i−1)-th pixel line of the M pixel lines and a 2i-th pixel line of the M pixel lines, and no pixel circuit group is disposed between the 2i-th pixel line and a (2i+1)-th pixel line of the M pixel lines; and i is a positive integer.

In some embodiments, each of the N pixel circuit groups includes a pixel driving sub-circuit group, and the pixel driving sub-circuit group includes pixel driving sub-circuits that are arranged in a p×q array; each of the M pixel lines includes p pixels sequentially arranged in a second direction, and each of the p pixels includes q/2 sub-pixels; the second direction is another of the row direction and the column direction; p and q are each a positive integer; and a pixel driving sub-circuit is electrically connected to a sub-pixel.

In some embodiments, each of the N pixel circuit groups further includes at least one functional sub-circuit disposed on at least one side of the pixel driving sub-circuit group in the second direction, and the functional sub-circuit includes a data selection circuit, an electrostatic discharge protection circuit or a side wire bonding pin area.

In some embodiments, the electrostatic discharge protection circuit and the side wire bonding pin area are arranged in a ring along an edge of the display area.

In some embodiments, the array substrate further includes at least one shift register circuit disposed between a j-th pixel line of the M pixel lines and one of a (j−1)-th pixel line and a (j+1)-th pixel line of the M pixel lines, j being a rounded value of M/2. No pixel driving sub-circuit group is disposed between the j-th pixel line and the one of the (j−1)-th pixel line and the (j+1)-th pixel line. The at least one shift register circuit is electrically connected to each pixel driving sub-circuit group in the N pixel circuit groups, and is configured to supply scan driving signals to each pixel driving sub-circuit group in the N pixel circuit groups.

In some embodiments, each of the N pixel circuit groups further includes at least one functional sub-circuit disposed on at least one side of the shift register circuit in the second direction, and the functional sub-circuit includes a data selection circuit, an electrostatic discharge protection circuit or a side wire bonding pin area.

In some embodiments, the array substrate further includes at least one shift register circuit. Each shift register circuit is disposed between two pixel lines that are different from two pixel lines between which a pixel driving sub-circuit group is disposed. The at least one shift register circuit includes a first shift register circuit and a second shift register circuit. The first shift register circuit and the second shift register circuit are electrically connected to a plurality of pixel driving sub-circuit groups in the N pixel circuit groups.

In some embodiments, the at least one shift register circuit includes a first shift register circuit and a second shift register circuit. The first shift register circuit is electrically connected to some of a plurality of pixel driving sub-circuit groups in the N pixel circuit groups, and the second shift register circuit is electrically connected to some other pixel driving sub-circuit groups of the plurality of pixel driving sub-circuit groups.

In some embodiments, the first shift register circuit and the second shift register circuit are arranged adjacently between two pixel lines.

In some embodiments, the first shift register circuit is disposed between two pixel lines that are different from two pixel lines between which the second shift register circuit is disposed.

In some embodiments, the at least one shift register further includes a first backup circuit and a second backup circuit. The first backup circuit is a backup of the first shift register circuit, and is configured to be electrically connected to corresponding pixel driving sub-circuit groups when the first shift register circuit fails, and to supply scan driving signals to its corresponding pixel driving sub-circuit groups. The second backup circuit is a backup of the second shift register circuit, and is configured to be electrically connected to corresponding pixel driving sub-circuit groups when the second shift register circuit fails, and to supply scan driving signals to its corresponding pixel driving sub-circuit groups.

In some embodiments, the first backup circuit and the first shift register circuit are disposed between same two pixel lines. The second backup circuit and the second shift register circuit are disposed between same two pixel lines.

In some embodiments, the first backup circuit and the first shift register circuit are located in different film layers, and the second backup circuit and the second shift register circuit are located in different film layers.

In some embodiments, the array substrate further includes a base, at least one fan-out structure and at least one side edge structure. The base includes a first surface and a second surface opposite to the first surface. The M pixel lines and the N pixel circuit groups are disposed on the first surface. The at least one fan-out structure is disposed on the second surface. Each fan-out structure includes a plurality of signal connection lines, and the plurality of signal connection lines extend from an edge of the second surface to a non-edge area of the second surface. Each side edge structure includes a plurality of side edge connection lines.

In some examples, one end of each of the plurality of side edge connection lines is electrically connected to a signal connection line of a corresponding fan-out structure, and another end of the each of the plurality of side edge connection lines is connected to a corresponding functional sub-circuit.

In some other examples, the array substrate includes at least one shift register circuit, and each shift register circuit is disposed on the first surface. One end of each side edge connection line of the plurality of side edge connection lines is electrically connected to a signal connection line in a corresponding fan-out structure, and another end of the side edge connection line is connected to a corresponding functional sub-circuit or a corresponding shift register circuit.

In another aspect, a display panel is provided. The display panel includes the array substrate as described in some embodiments above.

In some embodiments, the display panel further includes a control integrated circuit. The control integrated circuit is disposed on a second surface of a base of the array substrate. The control integrated circuit is electrically connected to a plurality of signal connection lines in a corresponding fan-out structure of the array substrate, and is configured to output control signals to the plurality of signal connection lines.

In some embodiments, the plurality of signal connection lines are electrically connected to a signal bonding terminal in the corresponding fan-out structure, and the signal bonding terminal is bonded to the control integrated circuit.

In yet another aspect, a spliced display panel is provided. The spliced display panel includes at least two display panels as described in some embodiments above that are spliced with each other.

In yet another aspect, a display driving method is provided. The display driving method is applied to the display panel as described in some embodiments above. The display driving method includes: controlling each pixel driving sub-circuit group in the N pixel circuit groups to supply pixel driving signals to two adjacent rows of sub-pixels or two adjacent columns of sub-pixels that are electrically connected to the pixel driving sub-circuit group.

In some embodiments, the display driving method further includes: transmitting, by a control integrated circuit disposed on a second surface of a base of the array substrate, control signals to the N pixel circuit groups and/or a shift register circuit disposed on a first surface of the base of the array substrate through at least one side edge structure.

BRIEF DESCRIPTION OF THE DRAWINGS

In order to describe technical solutions in the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on actual sizes of products and an actual process of a method to which the embodiments of the present disclosure relate.

DETAILED DESCRIPTION

Figure 1:
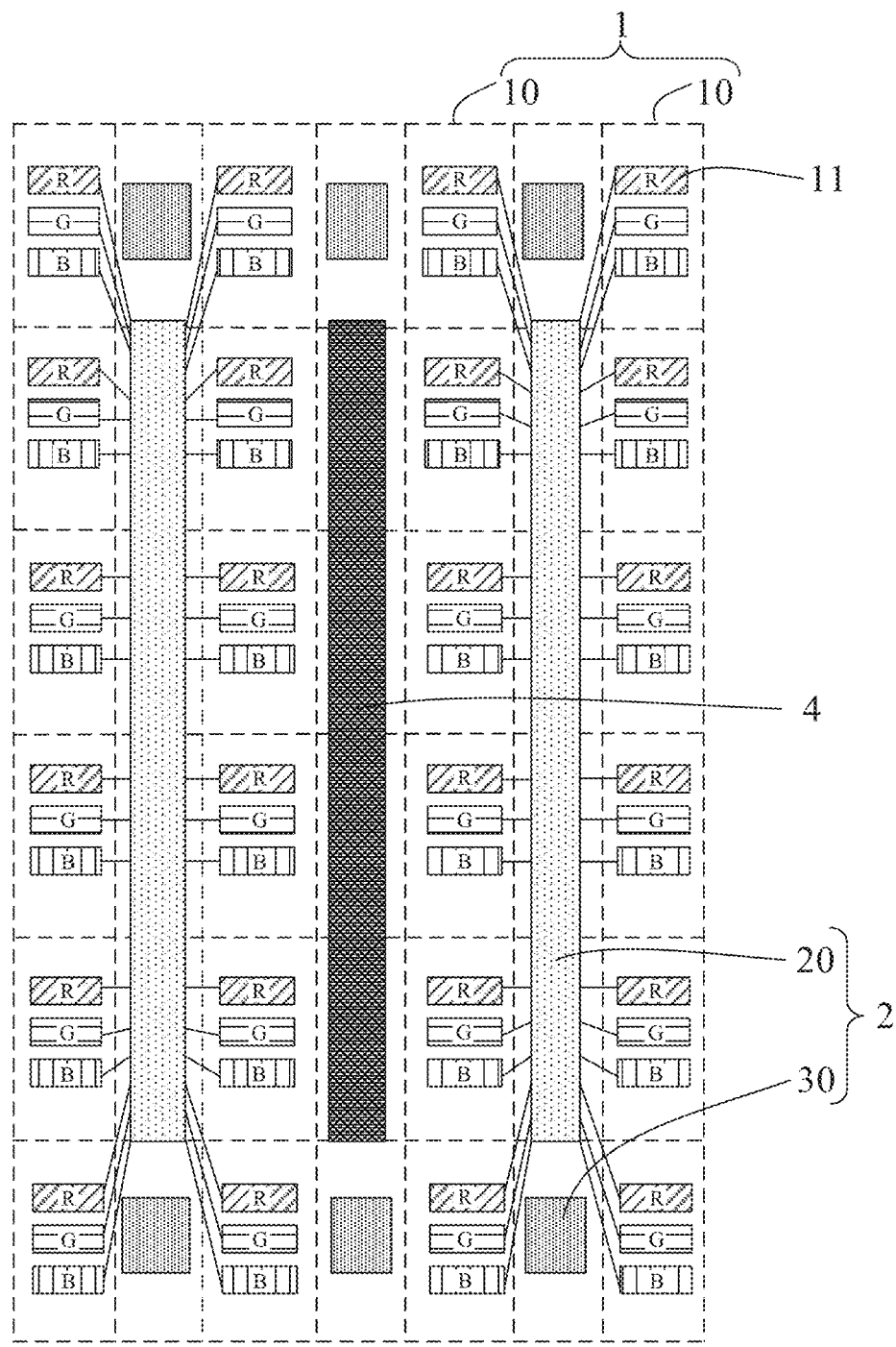
FIG. 1 is a schematic diagram of wiring of an array substrate, in accordance with some embodiments.

Technical solutions in some embodiments of the present disclosure will be described clearly and completely in combination with accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are interpreted as open and inclusive, i.e., "including, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to same embodiment(s) or example(s). In addition, specific features, structures, materials or characteristics may be included in any or more embodiments or examples in any suitable manner.

Terms such as "first" and "second" are only used for descriptive purposes and are not to be construed as indicating or implying relative importance or implicitly indicating the number of indicated technical features below. Thus, features defined by terms "first" and "second" may explicitly or implicitly include one or more of the features. In the description of the embodiments of the present disclosure, the term "a plurality of/the plurality of" means two or more unless otherwise specified. The expression "A and/or B" includes the following three combinations: only A, only B, and a combination of A and B.

With continuous development of display technologies, consumers have higher and higher requirements on screen sizes of display apparatuses, which causes spliced display panels to come into being. A conventional spliced display panel is usually formed by splicing a plurality of display panels.

In some examples, the display panels are all liquid crystal display (LCD) panels. However, due to existence of virtual pixels and a sealant for sealing a frame in the LCD panel, it is inevitable that there is a seam in the spliced display panel formed by splicing the LCD panels, and thus perfect seamless splicing may not be achieved.

In some other examples, the display panels are all organic light-emitting diode (OLED) display panels. However, since cathodes of OLEDs in the OLED display panel are formed by means of evaporation, and the light-emitting devices (i.e., the OLEDs) need to be encapsulated to block water and oxygen in the air to ensure service life of the display panel, it is inevitable that there is a seam in the spliced display panel formed by splicing the OLED display panels, and seamless splicing may not be achieved.

As for mini light-emitting diode (Mini-LED) display panels and micro light-emitting diode (Micro-LED) display panels, due to limitation of a development level of mass transfer technology in a current production process, there are many obstacles in directly achieving high resolution and a large size for the Mini-LED display panels and the Micro-LED display panels. However, defects of the current massive transfer technology may be effectively overcome through seamless splicing technology, so that huge screen display may be achieved by using the Mini-LED display panels or the Micro-LED display panels.

Figure 2:
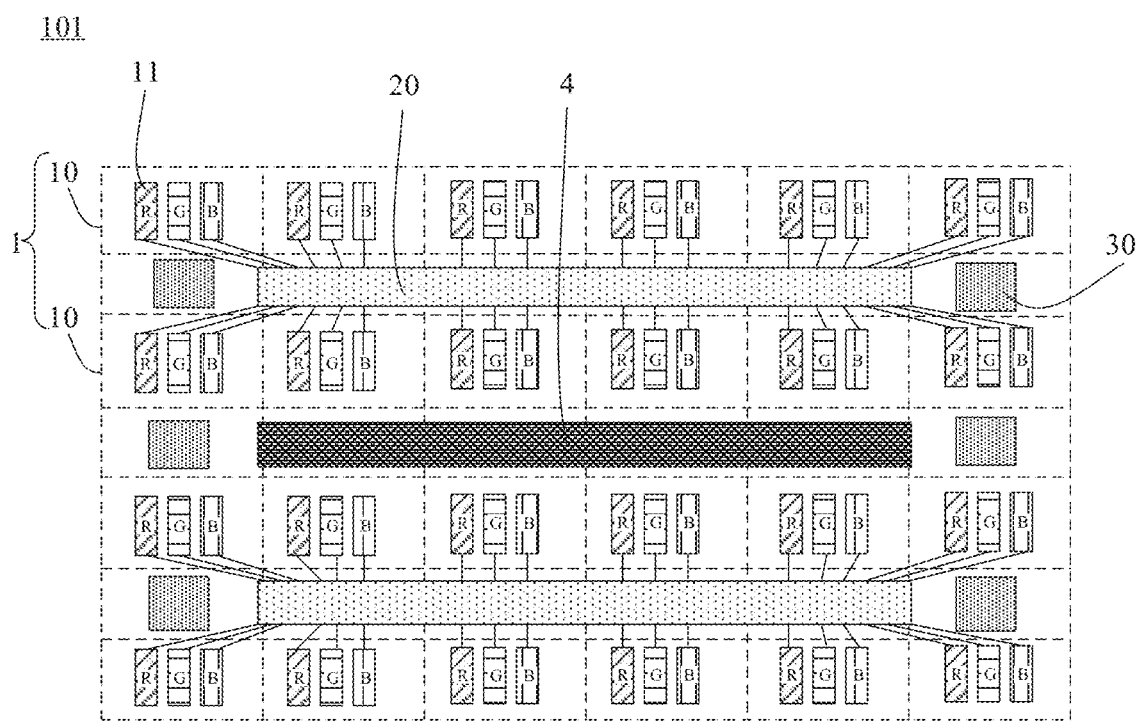
FIG. 2 is a schematic diagram of wiring of another array substrate, in accordance with some embodiments.
Figure 3:
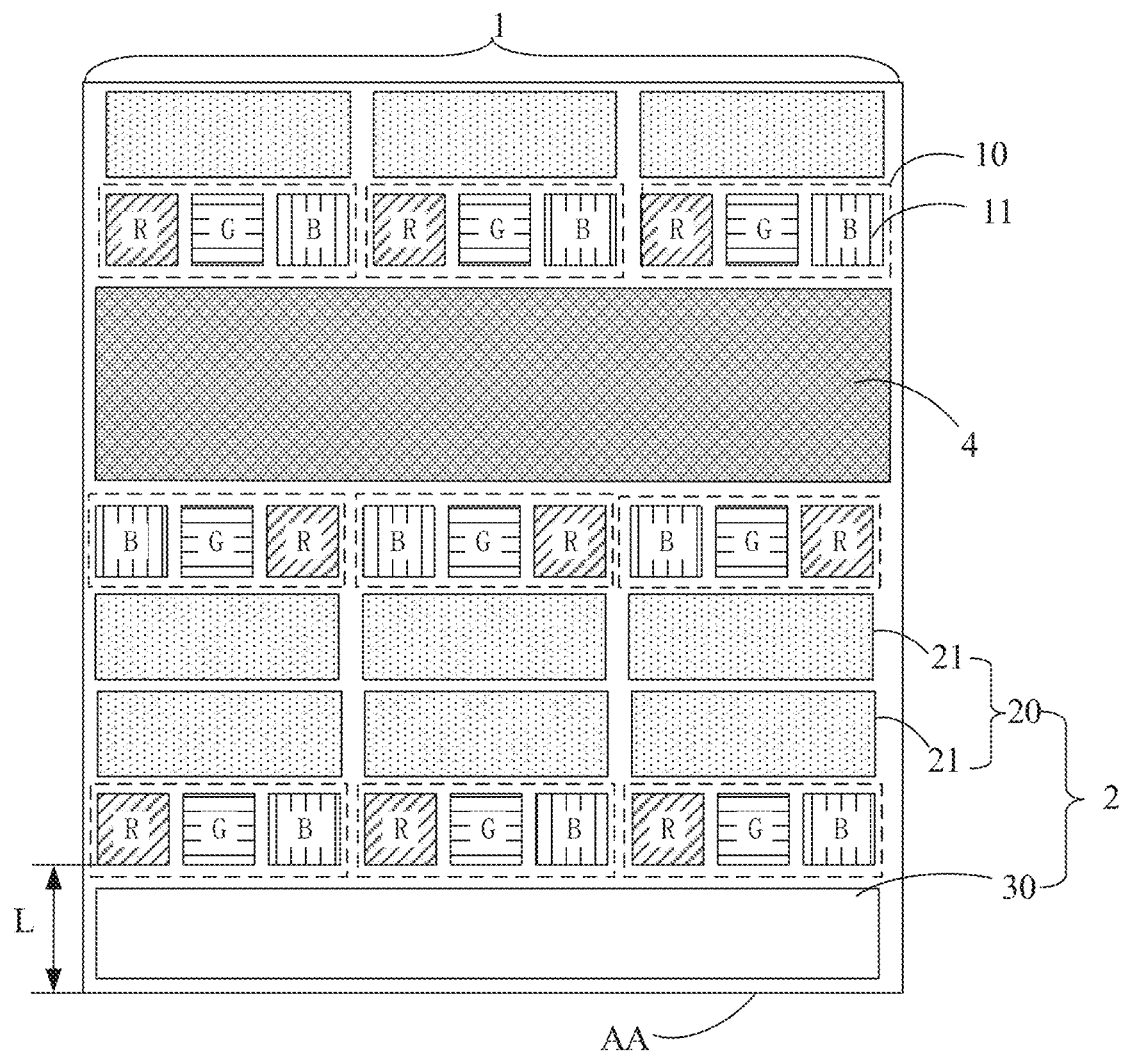
FIG. 3 is a schematic diagram of wiring of yet another array substrate, in accordance with some embodiments.

On the basis of these descriptions, some embodiments of the present disclosure provide an array substrate. Referring to FIGS. 1 to 3, the array substrate 101 includes a display area AA, at least one pixel group 1 and at least one pixel circuit group 2. The at least one pixel group 1 is disposed in the display area AA, and each pixel group 1 includes a plurality of pixels 10 arranged in an array. Each pixel circuit group 2 is disposed between two adjacent rows of pixels 10 or two adjacent columns of pixels 10 in a corresponding pixel group 1.

It will be understood that the array substrate 101 includes M pixel lines disposed in the display area and arranged in a first direction, and N pixel circuit groups 2 arranged in the first direction. M is an integer greater than or equal to 2, and N is a positive integer less than M. The first direction is one of the row direction and the column direction.

In a case where the first direction is the row direction, the M pixel lines refer to M columns of pixels 10; for example, two pixel lines means two columns of pixels 10. In a case where the first direction is the column direction, the M pixel lines refer to M rows of pixels 10; for example, two pixel lines means two rows of pixels 10.

Herein, each pixel 10 includes at least one sub-pixel 11. The at least one pixel circuit group 2 includes at least one pixel driving sub-circuit group 20. Each pixel driving sub-circuit group 20 is electrically connected to two rows of sub-pixels 11 adjacent thereto or two columns of sub-pixels 11 adjacent thereto, and is configured to supply pixel driving signals to the sub-pixels 11 electrically connected thereto.

In some examples, a single pixel circuit group of the N pixel circuit groups is disposed between a (2i−1)-th pixel line of the M pixel lines and a 2i-th pixel line of the M pixel lines, and no pixel circuit group is disposed between the 2i-th pixel line and a (2 k−1)-th pixel line of the M pixel lines; and i is a positive integer.

Optionally, each of the N pixel circuit groups includes a pixel driving sub-circuit group, and the pixel driving sub-circuit group includes pixel driving sub-circuits that are arranged in a p×q array. Each of the M pixel lines includes p pixels sequentially arranged in a second direction, and each of the p pixels includes $$\frac{q}{2}$$

sub-pixels; the second direction is another of the row direction and the column direction; and p and q are each a positive integer.

For example, when the first direction is the row direction, the second direction is the column direction; and when the first direction is the column direction, the second direction is the row direction.

Optionally, a pixel driving sub-circuit is electrically connected to a sub-pixel.

Optionally, the array substrate is of an RGB color display mode. Each pixel 10 includes three sub-pixels 11, i.e., a red sub-pixel R, a green sub-pixel G and a blue sub-pixel B. As shown in FIG. 3, each pixel driving sub-circuit group 20 includes a plurality of separate pixel driving sub-circuits 21, and a pixel driving sub-circuit 21 is connected to three sub-pixels of a pixel 10 correspondingly.

In some embodiments of the present disclosure, each pixel driving sub-circuit group 20 is disposed between two adjacent rows of pixels 10 or two adjacent columns of pixels 10, and the pixel driving sub-circuit group 20 is used for supplying pixel driving signals to the sub-pixels 11 in the two adjacent rows of pixels 10 or the two adjacent columns of pixels 10, so that integration of the pixel driving sub-circuits 21 may be effectively realized. That is, a pixel driving sub-circuit 21 corresponding to sub-pixels 11 on the array substrate 101 is arranged between part of rows of pixels 10 or part of columns of pixels 10 in a modular and concentrated manner, so that more space may be left in the display area AA of the array substrate. Other circuits required for display of the array substrate 101, such as a shift register circuit, a data selection (MUX) circuit or an electrostatic discharge (ESD) protection circuit, may be modularly placed in the space. In this way, a bezel of the array substrate 101 may be effectively reduced or even eliminated to facilitate achieving seamless splicing of the display panels.

The number of the pixel group(s) 1 and the number of the pixels 10 in each pixel group 1 may be set according to actual needs, for example, according to the resolution of the display panel in which the array substrate is located. For example, each pixel group 1 includes 12 (2 by 6) pixels 10, where 2 is the number of columns and 6 is the number of rows. In this case, each pixel driving sub-circuit group 20 may be disposed between two columns of pixels 10 in a corresponding pixel group 1. In addition, for example, a width of each pixel group 1 in a row direction or in a column direction is not limited as long as an arrangement of a corresponding pixel driving sub-circuit group 20 in the pixel group 1 may be achieved. A distance between every two adjacent pixel groups 1 in the row direction or a distance between every two adjacent pixel groups 1 in the column direction is greater than 70 µm.

It will be understood that the array substrate 101 is applied to a Micro-LED display panel or a Mini-LED display panel. Since the Micro-LED or Mini-LED has a small size and a high luminous intensity, the Micro-LED or Mini-LED may occupy only 10% of an area of each pixel 10 of the array substrate 101 at a minimum. Therefore, there is enough space in each pixel 10 or between adjacent pixels 10 of the array substrate 101 to arrange electric components of circuits.

In some embodiments, referring to FIG. 1, the number of the pixel group(s) 1 is at least two. The at least two pixel groups 1 are arranged in the row direction, that is, pixels 10 of the array substrate 101 are divided into at least two groups in the row direction. Each pixel driving sub-circuit group 20 is disposed between two adjacent columns of sub-pixels 11 in a corresponding pixel group 1. A length of the pixel driving sub-circuit group 20 in the column direction is less than a length of the pixel group 1 in the column direction. That is, each pixel driving sub-circuit group 20 is disposed between some pixels of two corresponding columns of pixels 10 in a centralized manner, so that some space is left on at least one side of each pixel driving sub-circuit group 20 in the column direction. In this way, the at least one pixel circuit group 2 further includes at least one functional sub-circuit 30 disposed on the at least one side of each pixel driving sub-circuit group 20 in the column direction. The at least one functional sub-circuit 30 includes a data selection (MUX) circuit, an electrostatic discharge (ESD) protection circuit or a side wire bonding pin area.

Of course, the type of the functional sub-circuit 30 is not limited thereto, and other circuits having certain driving or compensation or detection functions required for display of the array substrate 101 may be included. The side wire bonding pin area refers to concentrated leading-out terminals of a plurality of signal lines in the display area AA, such as a supply voltage terminal, a common voltage terminal and a clock signal terminal, and is configured to bond the signal lines to external input circuits.

As shown in FIG. 1, the pixel groups 1 are arranged in the row direction. For example, the pixel groups 1 are equally spaced. In this way, the expression of "being disposed on at least one side of each pixel driving sub-circuit group 20 in the column direction" means being disposed on at least one side of the array substrate 101 in the column direction (e.g., a top side, a bottom side or both the top side and the bottom side shown in FIG. 1). Therefore, a space utilization rate of the display area AA of the array substrate 101 may be effectively improved to reasonably and easily place other functional sub-circuits 30 required for display of the array substrate 101, such as the shift register circuit, the data selection (MUX) circuit or the electrostatic discharge (ESD) protection circuit. Furthermore, the bezel of the array substrate 101 may be effectively reduced or even eliminated to facilitate achieving seamless splicing of the display panels. In addition, pixel driving sub-circuit groups 20 and functional sub-circuits 30 in the array substrate 101 are modularly and regularly distributed in the display area AA, which may effectively reduce risk of forming static electricity and additional capacitance.

A size of the array substrate 101 is selectively set according to actual needs, for example, set to be a small size. In this way, a display panel corresponding to each array substrate 101 serves as a smallest spliceable unit, so that a large-sized display panel with any size may be formed by splicing.

In addition, it will be noted that each pixel driving sub-circuit group 20 is disposed between multiple pixels 10 in two corresponding columns of pixels 10 in a centralized manner, and the less the number of the multiple pixels 10 is, the more abundant space may be obtained. Considering uniformity of signal transmission, a resistance of a wire between each pixel driving sub-circuit 21 in each pixel driving sub-circuit group 20 and a corresponding sub-pixel 11 needs to be equal or approximately equal. Optionally, a difference between resistances of wires between any two pixel driving sub-circuits 21 in the pixel driving sub-circuit group 20 and corresponding sub-pixels 11 is not greater than 100 ohms, so that delay of signals transmitted from the any two pixel driving sub-circuits 21 to the corresponding sub-pixels 11 does not exceed 0.01 µs at most, and requirement of display uniformity may be achieved.

Similarly, in some other examples, referring to FIG. 2, the number of pixel group(s) 1 is at least two. The at least two pixel groups 1 are arranged in the column direction. Each pixel driving sub-circuit group 20 is disposed between two adjacent rows of sub-pixels 11 in a corresponding pixel group 1. A length of the pixel driving sub-circuit group 20 in the row direction is less than a length of the pixel group 1 in the row direction. The at least one pixel circuit group 2 further includes at least one functional sub-circuit 30 disposed on at least one side of each pixel driving sub-circuit group 20 in the row direction. The functional sub-circuit 30 includes the data selection (MUX) circuit, the electrostatic discharge (ESD) protection circuit or the side wire bonding pin area.

As shown in FIG. 2, the pixel groups 1 are arranged in the column direction. For example, the pixel groups 1 are equally spaced. In this way, the expression of "being disposed on at least one side of each pixel driving sub-circuit group 20 in the row direction" means being disposed on at least one side of the array substrate 101 in the row direction (e.g., a left side, a right side or both the left side and the right side shown in FIG. 2). In this way, with regard to beneficial effects of the array substrate 101 with the above structure, reference may be made to beneficial effects of the corresponding array substrate 101 when the pixel groups 1 are linearly arranged in the row direction, which will not be described herein again.

It will be understood that the pixel driving sub-circuits 21 in each pixel driving sub-circuit group 20 of the array substrate 101 generally require shift control signals output by a shift register circuit, so as to be turned on sequentially. In some embodiments, with continued reference to FIGS. 1 to 3, the array substrate 101 further includes at least one shift register circuit 4. Each shift register circuit 4 is disposed between two rows of sub-pixels 11 or two columns of sub-pixels 11 that are different from two rows of sub-pixels 11 or two columns of sub-pixels 11 between which the a pixel driving sub-circuit group 20 are disposed. Optionally, the shift register circuit 4 is disposed in a gap between two adjacent pixel groups 1 in the row direction or the column direction, or in a gap between two adjacent rows of sub-pixels 11 or two adjacent columns of sub-pixels 11 in a corresponding pixel group 10. The gap is greater than 70 µm.

In some embodiments of the present disclosure, the shift register circuit 4 is placed between two corresponding rows of pixels 10 or two corresponding columns of pixels 10, which may effectively reduce or even eliminate the bezel of the array substrate 101 to facilitate achieving seamless splicing of the display panels. In addition, the shift register circuit 4 is arranged in the above manner, which may not only avoid splitting the shift register circuit 4 to reduce signal transmission delay caused by splitting the shift register circuit 4, but also help simplify design difficulty of wiring layout of the array substrate 101 (e.g., achieving layout array of small size layout units), thereby improving layout design efficiency and subsequent detection efficiency.

Moreover, electronic components such as thin film transistors in the shift register circuit 4 do not need to be split and dispersed into each pixel 10, which may effectively reduce wiring complexity of the array substrate 101, reduce additional parasitic capacitance, and avoid problems of a reduction in aperture ratio and electrostatic interference in the array substrate 101.

The shift register circuit 4 is electrically connected to the at least one pixel driving sub-circuit group 20, and is configured to supply scan driving signals to the at least one pixel driving sub-circuit group 20.

Herein, it will be noted that the pixel driving sub-circuits 21 corresponding to a plurality of pixels 10 in at least one row or at least one column are electrically connected to a same scan signal line. The shift register circuit 4 is electrically connected to the at least one pixel driving sub-circuit group 20, which means that the shift register circuit 4 is electrically connected to the corresponding pixel driving sub-circuits 21 through each scan signal line, so as to supply a scan driving signal to each pixel driving sub-circuit 21.

Optionally, the scan signal line includes a gate scan signal line or a light-emitting scan signal line. Arrangement and functions of the gate scan signal line and the light-emitting scan signal line may be referred to relevant technologies, which will not be described in detail herein. In some embodiments, referring to FIG. 1, the number of the pixel group(s) 1 is at least two. The at least two pixel groups 1 are arranged in the row direction. The shift register circuit 4 is disposed between two pixel groups 10 or between two adjacent columns of sub-pixels 11 in the corresponding pixel group 10. A length of the shift register circuit 4 in the column direction is less than a length of the pixel group 1 in the column direction, that is, the shift register circuit 4 is disposed between some pixels 10 in two corresponding columns of pixels 10 in a centralized manner, so that some space is left on at least one side of the shift register circuit 4 in the column direction. In this way, the at least one pixel circuit group 2 further includes at least one functional sub-circuit 30 disposed on at least one side of the shift register circuit 4 in the column direction, and the functional sub-circuit 30 includes the data selection (MUX) circuit, the electrostatic discharge (ESD) protection circuit or the side wire bonding pin area.

As shown in FIG. 1, the pixel groups 1 are linearly arranged in the row direction, and in this way, the expression of "being disposed on at least one side of the shift register circuit 4 in the column direction" means being disposed on at least one side of the array substrate 101 in the column direction (e.g., the top side, the bottom side or both the top side and the bottom side shown in FIG. 1). Therefore, the space utilization rate of the display area AA of the array substrate 101 may be further improved to reasonably and easily place other functional sub-circuits 30 required for display of the array substrate 101. Furthermore, the bezel of the array substrate 101 may be effectively reduced or even eliminated to facilitate achieving seamless splicing of the display panels.

In addition, it will be noted that the shift register circuit 4 is disposed between multiple pixels 10 in two corresponding columns of pixels 10 in a centralized manner, and the less the number of the multiple pixels 10 is, the more abundant space may be obtained. Considering uniformity of signal transmission, a resistance of a wire between the shift register circuit 4 and each scan signal line needs to be equal or approximately equal. A difference between resistances of wires between the shift register circuit 4 and any two of the scan signal lines is not greater than 100 ohms, so that delay of signals transmitted from the shift register circuit 4 to the any two scan signal lines does not exceed 0.01 μs at most, and requirement of display uniformity may be achieved.

Similarly, in some other embodiments, referring to FIG. 2, the number of the pixel group(s) 1 is at least two. The at least two pixel groups 1 are arranged in the column direction. The shift register circuit 4 is disposed between two pixel groups 1 or between two adjacent rows of sub-pixels 11 in the corresponding pixel group 1. A length of the shift register circuit 4 in the row direction is less than the length of the pixel group 1 in the row direction. The at least one pixel circuit group 2 further includes at least one functional sub-circuit 3 disposed on at least one side of the shift register circuit 4 in the row direction, and the functional sub-circuit 3 includes the data selection (MUX) circuit, the electrostatic discharge (ESD) protection circuit or the side wire bonding pin area.

As shown in FIG. 2, the pixel groups 1 are linearly arranged in the column direction. In this way, the expression of "being disposed on at least one side of the shift register circuit 4 in the row direction" means being disposed on at least one side of the array substrate 101 in the row direction (e.g., the left side, the right side or both left and right sides shown in FIG. 2). In this way, beneficial effects of the array substrate 101 with the above structure may be referred to the beneficial effects of the corresponding array substrate 101 when the pixel groups 1 are linearly arranged in the row direction, which will not be described herein again.

In some examples, the at least one shift register circuit disposed between a j-th pixel line of the M pixel lines and one of a (j−1)-th pixel line and a (j+1)-th pixel line of the M pixel lines, j is a rounded value of $$\frac{M}{2},$$

and no pixel driving sub-circuit group is disposed between the j-th pixel line and the one of the (j−1)-th pixel line and the (j+1)-th pixel line.

Figure 4:
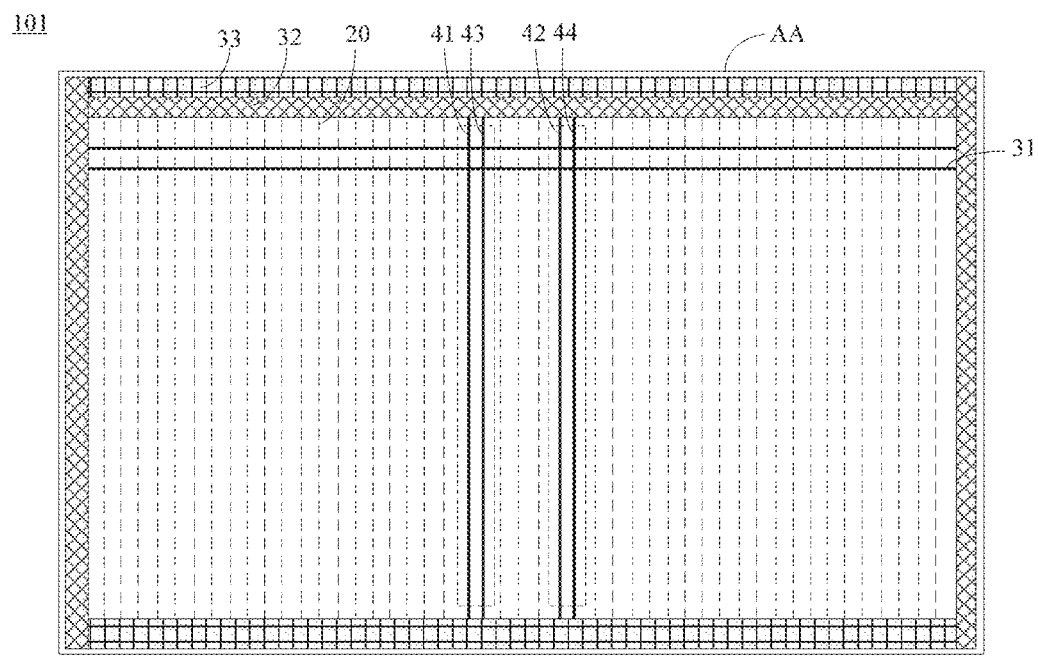
FIG. 4 is a schematic diagram of wiring of yet another array substrate, in accordance with some embodiments.
Figure 5:
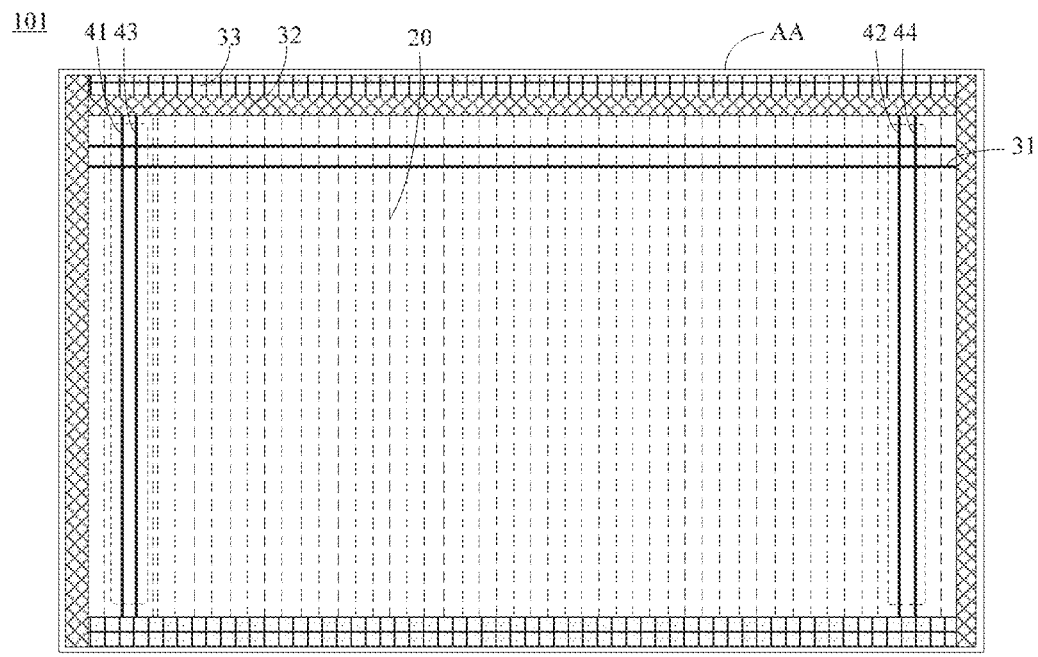
FIG. 5 is a schematic diagram of wiring of yet another array substrate, in accordance with some embodiments.
Figure 15:
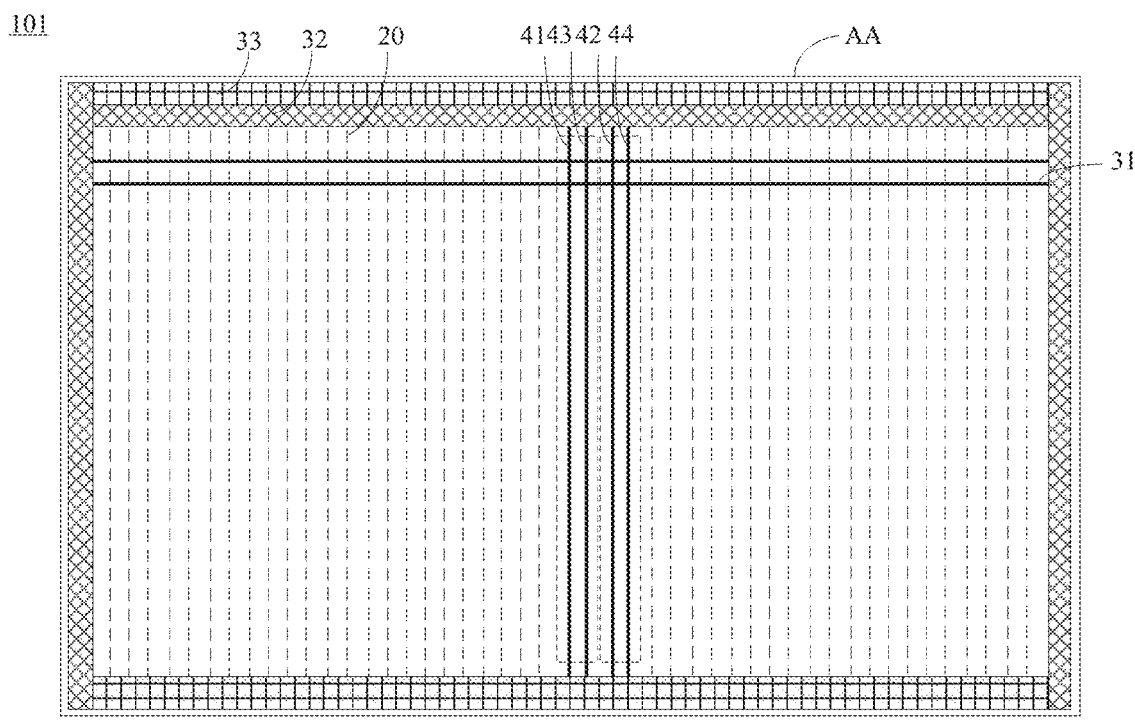
FIG. 15 is a schematic diagram of wiring of yet another array substrate, in accordance with some embodiments.

In some embodiments, referring to FIGS. 4, 5 and 15, the shift register circuit 4 includes a first shift register circuit 41 and a second shift register circuit 42 to facilitate bilateral driving of scan signals, thereby effectively improving display uniformity of the display panel where the array substrate 101 is located.

Positions of the first shift register circuit 41 and the second shift register circuit 42 in the display area AA may be set according to actual needs. For example, as shown in FIG. 4, the first shift register circuit 41 and the second shift register circuit 42 are disposed in the middle area of the display area AA. That is, the first shift register circuit 41 and the second shift register circuit 42 transmit scan driving signals from the middle area of the display area AA to both sides thereof. Of course, as shown in FIGS. 5 and 15, the first shift register circuit 41 and the second shift register circuit 42 are disposed at portions to which both edges of the display area AA extend inward, respectively. That is, it is also permissible that the first shift register circuit 41 and the second shift register circuit 42 may transmit scan driving signals from both sides of the display area AA to the middle area thereof. Some embodiments of the present disclosure do not limit this.

In some examples, positions of the first shift register circuit 41 and the second shift register circuit 42 in the array substrate 101 are determined according to a distance between two adjacent rows or two adjacent columns of pixels 10 in the array substrate 101. Optionally, as shown in FIG. 15, the first shift register circuit 41 and the second shift register circuit 42 are disposed adjacently between two rows of pixels 10 or two columns of pixels 10, which facilitates wiring design and fabrication. Optionally, as shown in FIGS. 4 and 5, two rows of pixels 10 or two columns of pixels 10 between which the first shift register circuit 41 is disposed are different from two rows of pixels 10 or two columns of pixels 10 between which the second shift register circuit 42 is disposed, which is beneficial to improve display uniformity.

In some examples, the array substrate includes a plurality of pixel driving sub-circuit groups 20, and the first shift register circuit 41 and the second shift register circuit 42 are electrically connected to the pixel driving sub-circuit groups 20. That is, the first shift register circuit 41 and the second shift register circuit 42 are electrically connected to same pixel driving sub-circuit groups 20. In some other examples, the first shift register circuit 41 is electrically connected to some of the pixel driving sub-circuit groups 20. The second shift register circuit 42 is electrically connected to some other pixel driving sub-circuit groups in the pixel driving sub-circuit groups 20. That is, the first shift register circuit 41 and the second shift register circuit 42 are electrically connected to different pixel driving sub-circuit groups 20.

In some embodiments described above, that the first shift register circuit 41 is electrically connected to corresponding pixel driving sub-circuit groups 20 means that, the first shift register circuit 41 is electrically connected to pixel driving sub-circuits in the pixel driving sub-circuit groups 20 through a plurality of scan signal lines. That the second shift register circuit 42 is electrically connected to corresponding pixel driving sub-circuit groups 20 means that, the second shift register circuit 42 is electrically connected to pixel driving sub-circuits in the pixel driving sub-circuit groups 20 through a plurality of scan signal lines.

It is worth mentioning that in some embodiments, with continued reference to FIGS. 4, 5 and 15, the shift register circuit 4 further includes a first backup circuit 43 and a second backup circuit 44. The first backup circuit 43 is a backup of the first shift register circuit 41, and is configured to be electrically connected to corresponding pixel driving sub-circuit groups 20 when the first shift register circuit 41 fails, and to supply scan driving signals to the corresponding pixel driving sub-circuit groups. The second backup circuit 44 is a backup of the second shift register circuit 42, and is configured to be electrically connected to corresponding pixel driving sub-circuit groups 20 when the second shift register circuit 42 fails, and to supply scan driving signals to the corresponding pixel driving sub-circuit groups 20.

Herein, that the first backup circuit 43 is the backup of the first shift register circuit 41 means that, electronic components included in the first backup circuit 43 and the first shift register circuit 41 are the same, and connection manners and working principles of the first backup circuit 43 and the first shift register circuit 41 are the same. The first backup circuit 43 is disposed in the array substrate 101 separately (that is, the first backup circuit is not electrically connected to other circuits and exists as a redundant circuit). In this way, when the first shift register circuit 41 fails, the first backup circuit 43 is electrically connected to corresponding pixel driving sub-circuit groups 20 by means of laser repairing, etc., so that the first backup circuit 43 can replace the first shift register circuit 41 to supply scan driving signals to the corresponding pixel driving sub-circuit groups to ensure normal use of the array substrate. It will be understood that the first backup circuit 43 and the first shift register circuit 41 may be located in different film layers. In this way, the first backup circuit 43 is also capable of performing electrostatic protection on the first shift register circuit 41, thereby effectively improving yields of the array substrate and a corresponding display panel.

A relationship between the second backup circuit 44 and the second shift register circuit 42 may be correspondingly referred to the above relevant expression between the first backup circuit 43 and the first shift register circuit 41, which will not be described in detail herein.

In addition, in some examples, the first backup circuit 43 and the first shift register circuit 41 are disposed between the same two rows of pixels 10 or the same two columns of pixels 10. The second backup circuit 44 and the second shift register circuit 42 are disposed between the same two rows of pixels 10 or the same two columns of pixels 10.

Based on a fact that the first backup circuit 43 and the first shift register circuit 41 are disposed in different film layers, it is permissible that orthographic projections of the first backup circuit 43 and the first shift register circuit 41 on a base of the array substrate may coincide, roughly coincide or may not coincide. Similarly, it is also permissible that orthographic projections of the second backup circuit 44 and the second shift register circuit 42 on the base of the array substrate may coincide, roughly coincide or may not coincide.

Figure 6:
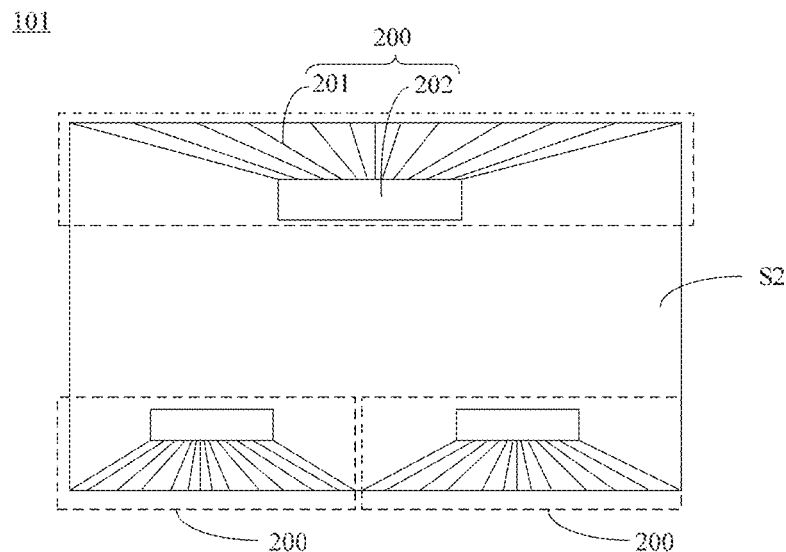
FIG. 6 is a structural diagram of a second surface of an array substrate, in accordance with some embodiments.
Figure 7:
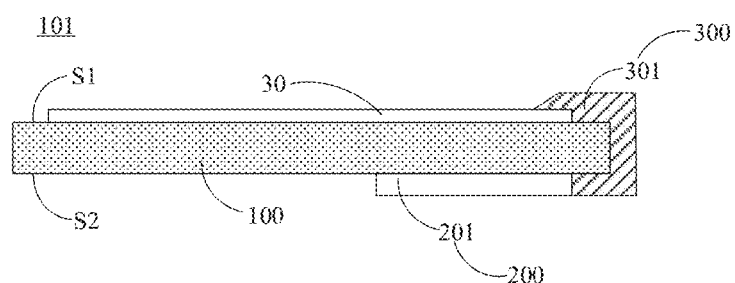
FIG. 7 is a cross-sectional view of an edge portion of an array substrate; in accordance with some embodiments.
Figure 8:
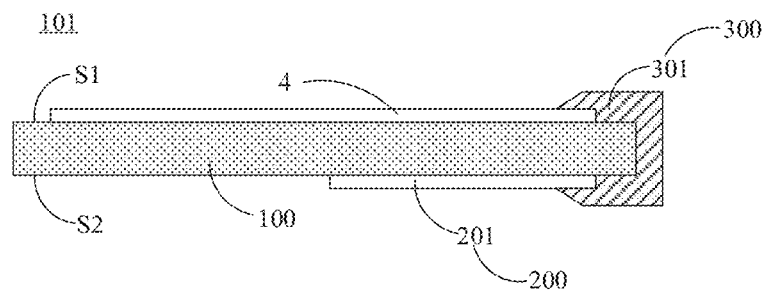
FIG. 8 is a cross-sectional view of an edge portion of another array substrate, in accordance with some embodiments.

Referring to FIGS. 6 to 8, a base 100 of the array substrate 101 includes a first surface S1 and a second surface S2 opposite to the first surface S1, The pixel groups 1, the pixel circuit groups 2 and the shift register circuit 4 in some embodiments described above are disposed on the first surface S1 of the base 100.

In some embodiments, with continued reference to FIGS. 6 to 8, the array substrate 101 further includes at least one fan-out structure 200 located on the second surface S2 of the base 100, and at least one side edge structure 300 located on a side face between the first surface S1 and the second surface S2 of the base 100.

Each fan-out structure 200 includes a plurality of signal connection lines 201, and the plurality of signal connection lines 201 extend from an edge of the second surface S2 of the base 100 to a non-edge area thereof. Each fan-out structure 200 further includes a signal bonding terminal 202 electrically connected to the plurality of signal connection lines 201, and the signal bonding terminal 202 is configured to be bonded to an external input circuit. The external input circuit includes a control integrated circuit, a flexible circuit board or a printed circuit board, etc.

Each side edge structure 300 includes a plurality of side edge connection lines 301, one end of each side edge connection line 301 is electrically connected to a signal connection line 201 in a corresponding fan-out structure 200, and another end of the side edge connection line 301 is connected to a corresponding functional sub-circuit 3 or a corresponding shift register circuit 4.

Herein, the fan-out structures 200 may be in one-to-one correspondence with the side edge structures 300, or a plurality of side edge structures 300 may correspond to one fan-out structure 200. The numbers of fan-out structures 200 and side edge structures 300 and specific positions thereof may be selectively set according to actual needs, so as to facilitate wiring and accurately realize electrical connection of corresponding circuits.

The signal connection lines 201 and the side connection lines 301 are made of a conductive material. For example, the conductive material is a metal or a conductive silver adhesive, and the metal includes at least one of silver, copper, etc., so as to ensure that the signal connection lines 201 and the side connection lines 301 have good conductivity.

In addition, the side edge structure 300 is disposed on the side face between the first surface S1 and the second surface S2 of the base 100, and may be arranged in a variety of ways. For example, an orthographic projection of the side edge structure 300 on the second surface S2 of the base 100 does not overlap (as shown in FIG. 7) or partially overlaps (as shown in FIG. 8) with an orthographic projection of a corresponding fan-out structure 200 on the second surface S2.

In some embodiments of the present disclosure; the fan-out structure 200 is disposed on the second surface S2 of the base 100, and the side edge structure 300 is disposed on the side face of the base 100, so that signal lines originally located in the non-display area of the array substrate can be disposed on the side face and the second surface S2 of the base 100. Therefore, a bezel size of the array substrate 101 may be reduced or even eliminated to facilitate the realization of seamless splicing.

When the array substrate in some embodiments described above is manufactured, circuit structures such as the pixel groups 1, the pixel circuit groups 2 and the shift register circuit 4 may be formed on the first surface S1 of the base 100 first, and then the fan-out structures 200 are formed on the second surface S2 of the base 100; or the fan-out structures 200 may be formed on the second surface S2 of the base 100 first, and then the pixel groups 1, the pixel circuit groups 2, the shift register circuit 4, etc., are formed on the first surface S1 of the base 100. That is, a sequence of forming the circuit structures on the first surface S1 of the base 100 and forming the fan-out structures on the second surface S2 of the base 100 is not limited in some embodiments of the present disclosure.

Finally, the side edge structures 300 are formed on the side face between the first surface S1 and the second surface S2 of the base 100. The side edge structures 300 may be formed by one of 3D printing, photocopying, sputtering, etching, etc.

It will be noted that drawings in some embodiments described above are only schematic illustrations of circuit layout in the array substrate 101. That is, the drawings in some embodiments described above are only limited in spatial orientation with respect to arrangement positions of different circuit structures in the array substrate 101. Electrical components in the different circuit structures and a corresponding electrical connection relationship among each other may be referred to related solutions in the related art.

In order to more clearly illustrate the array substrate 101 in some embodiments described above, the following description is made by taking the array substrate in the Micro-LED display panel or the Mini-LED display panel as an example.

In the array substrate of the Micro-LED display panel or the Mini-LED display panel, as shown in FIG. 3, based on the mass transfer technology of LED and conduction characteristic thereof, LED bonding terminals of the sub-pixels in each pixel 10 are disposed in an area of the pixel 10, and a distance L from LED bonding terminals adjacent to an edge of the display area AA to the edge is a fixed value, for example, is in a range of 150 μm to 200 μm. Therefore, the functional sub-circuits 30 such as the data selection circuit, the electrostatic discharge protection circuit and the side wire bonding pin area that occupy a large space in the array substrate are placed in an area adjacent to the edge of the display area AA, for example, in a space corresponding to a first row of pixels 10 and a second row of pixels 10, or in a space corresponding to a last row of pixels 10 and a second to last row of pixels 10, which may make the layout of the circuit structures in the array substrate be designed more reasonably and may make the space utilization rate in the display area AA of the array substrate be effectively improved.

For example, as shown in FIGS. 4 and 5, in the edge area of the display area AA or in a space of some of rows of pixels 10 or some of columns of pixels 10 to which a peripheral edge of the display area AA extends inward, the electrostatic discharge protection circuit 32 and the side wire bonding pin area 33 are provided to facilitate electrically connecting to the external input circuit (e.g. an integrated circuit) through the side edge structures 300 that are disposed on the side face of the base 100, for example, bonding to the external input circuit through the fan-out structures 200 corresponding to the side edge structures 300. Herein, the electrostatic discharge protection circuit 32 and the side wire bonding pin area 33 may be arranged in a ring along the edge of the display area AA.

The data selection circuit 31 is disposed in the space of some of rows of pixels 10 to which the peripheral edge of the display area AA extends inward, and the pixel driving sub-circuit group 20 and the shift register circuit 4 are disposed in the space of some of columns of pixels 10 in the display area AA, which may effectively reduce overlap of signals to reduce transmission delay of signals.

In some examples, each type of signal lines (e.g., light-emitting signal lines EM, enabling signal lines Vinit, reset signal lines Reset, or reference voltage lines Vref) in the display area AA of the array substrate are connected in a grid, and use a form of global input of an entire panel, so that difference of corresponding signal inputs may be reasonably reduced.

Figure 9:
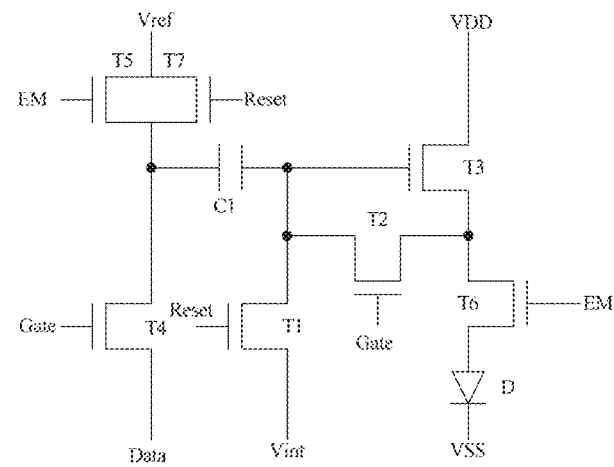
FIG. 9 is an equivalent circuit diagram of a pixel driving sub-circuit, in accordance with some embodiments.

In some examples, a structure of the pixel driving sub-circuit 21 is as shown in FIG. 9. The pixel driving sub-circuit 21 includes a first transistor T1, a second transistor T2, a third transistor T3, a fourth transistor T4, a fifth transistor T5, a sixth transistor T6, a seventh transistor T7, a first storage capacitor C1 and a light-emitting device D. A first electrode of the first transistor T1 is connected to an initial voltage signal terminal Vint. A second electrode of the first transistor T1 is connected to a second electrode of the first storage capacitor C1, a first electrode of the second transistor T2 and a control electrode of the third transistor T3. A control electrode of the first transistor T1 is connected to a reset signal terminal Reset. A second electrode of the second transistor T2 is connected to a second electrode of the third transistor T3 and a first electrode of the sixth transistor T6. A control electrode of the second transistor T2 is connected to a gate scan signal line Gate. A first electrode of the third transistor T3 is connected to a first supply voltage terminal VDD. A first electrode of the fourth transistor T4 is connected to a data line Data. A second electrode of the fourth transistor T4 is connected to a second electrode of the fifth transistor T5, a second electrode of the seventh transistor T7 and a first electrode of the first storage capacitor C1, A control electrode of the fourth transistor T4 is connected to the gate scan signal line Gate. A first electrode of the fifth transistor T5 is connected to a reference voltage signal terminal Vref. A control electrode of the fifth transistor T5 is connected to a light-emitting scan signal line EM. A second electrode of the sixth transistor T6 is connected to a first electrode of the light-emitting device D. A control electrode of the sixth transistor T6 is connected to the light-emitting scan signal line EM. A first electrode of the seventh transistor T7 is connected to the reference voltage signal terminal Vref. A control electrode of the seventh transistor T7 is connected to the reset signal terminal Reset. A second electrode of the light-emitting device is connected to a second supply voltage terminal VSS.

Figure 10:
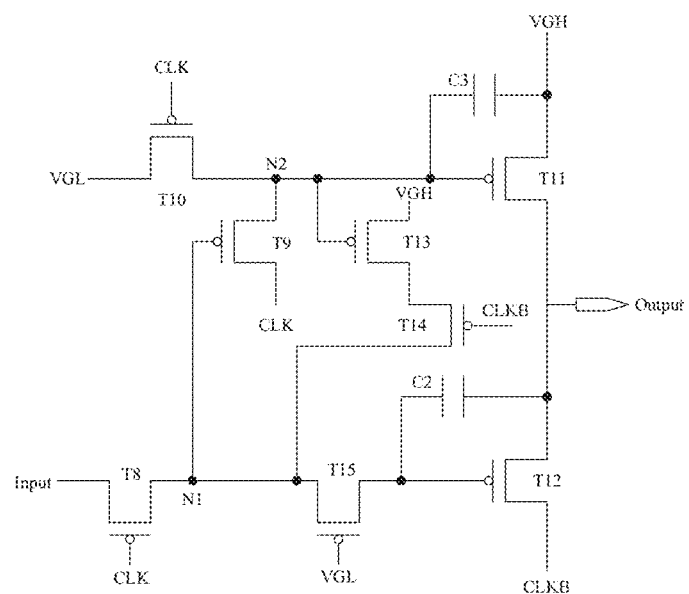
FIG. 10 is an equivalent circuit diagram of a shift register, in accordance with some embodiments.
Figure 11:
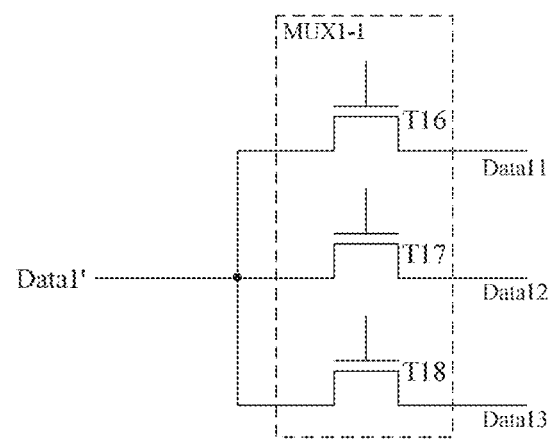
FIG. 11 is an equivalent circuit diagram of a data selection circuit, in accordance with some embodiments.

In some examples, the shift register circuit 4 includes a plurality of shift registers connected in cascade, and a structure of each shift register is as shown in FIG. 10. The shift register includes an eighth transistor T8, a ninth transistor T9, a tenth transistor T10, an eleventh transistor T11, a twelfth transistor T12, a thirteenth transistor T13, a fourteenth transistor T14, a second storage capacitor C2 and a third storage capacitor C3. A first electrode of the eighth transistor T8 is connected to a signal input terminal Input. A second electrode of the eighth transistor T8 is connected to a N1 node. A control electrode of the eighth transistor T8 is connected to a first clock signal terminal CLK. A first electrode of the ninth transistor T9 is connected to the first clock signal terminal CLK. A second electrode of the ninth transistor T9 is connected to a N2 node. A control electrode of the ninth transistor T9 is connected to the N1 node. A first electrode of the tenth transistor T10 is connected to a low-level signal terminal VGL. A second electrode of the tenth transistor T10 is connected to the N2 node. A control electrode of the tenth transistor T10 is connected to the first clock signal terminal CLK. A first electrode of the eleventh transistor T11 is connected to a high-level signal terminal VGH and a second electrode of the third storage capacitor C3. A second electrode of the eleventh transistor T11 is connected to a signal output terminal Output. A control electrode of the eleventh transistor T11 is connected to the N2 node. A first electrode of the third storage capacitor C3 is connected to the N2 node. A first electrode of the twelfth transistor T12 is connected to a second clock signal terminal CLKB. A second electrode of the twelfth transistor T12 is connected to a second electrode of the second storage capacitor C2 and the signal output terminal Output. A control electrode of the twelfth transistor T12 is connected to a first electrode of the second storage capacitor C2. A first electrode of the thirteenth transistor T13 is connected to the high-level signal terminal VGH. A second electrode of the thirteenth transistor T13 is connected to a first electrode of the fourteenth transistor T14. A control electrode of the thirteenth transistor T13 is connected to the N2 node. A second electrode of the fourteenth transistor T14 is connected to the N1 node. A control electrode of the fourteenth transistor T14 is connected to the second clock signal terminal CLKB, A first electrode of the fifteenth transistor T15 is connected to the N1 node. A second electrode of the fifteenth transistor T15 is connected to the first electrode of the second storage capacitor C2, A control electrode of the fifteenth transistor T15 is connected to the low-level signal terminal VGL.

In some examples, the data selection circuit 31 includes a sixteenth transistor T16, a seventeenth transistor T17 and an eighteenth transistor T18. A first electrode of the sixteenth transistor T16, a first electrode of the seventeenth transistor T17 and a first electrode of the eighteenth transistor T18 are connected together, and are connected to a source driver (not shown in the figure) through a data voltage lead-in line Data1'. A second electrode of the sixteenth transistor T16 is connected to a first data line Data11, and a control electrode of the sixteenth transistor T16 is connected to a first output terminal of a timing controller (not shown in the figure). A second electrode of the seventeenth transistor T17 is connected to a second data line Data12, and a control electrode of the seventeenth transistor T17 is connected to a second output terminal of the timing controller. A second electrode of the eighteenth transistor T18 is connected to a third data line Data13, and a control electrode of the eighteenth transistor T18 is connected to a third output terminal of the timing controller.

Transistors used in the some examples described above may be thin film transistors or field-effect transistors or similar devices with other characteristics. Since the source electrode and the drain electrode of the transistor used are symmetrical, there is no difference between the source electrode and the drain electrode.

In order to distinguish the source electrode and the drain electrode of the transistor in the some examples described above, one of the source electrode and the drain electrode is referred to as a first electrode, another one is referred to as a second electrode, and a gate electrode is referred to as a control electrode. Moreover, according to characteristics of transistors, transistors may be classified into N-type transistors and P-type transistors. In a case where the P-type transistor is used, a first electrode of the P-type transistor is a source electrode, and a second electrode of the P-type transistor is a drain electrode, and the source electrode and the drain electrode are connected when a low level is input to the gate electrode. In a case where the N-type transistor is used, the first electrode of the N-type transistor is a source electrode, the second electrode of the N-type transistor is a drain electrode, and the source electrode and the drain electrode are connected when a high level is input to the gate electrode.

In addition, the transistors in the pixel driving sub-circuit 21 are illustrated by taking the N-type transistors as an example. It is conceivable that implementation of P-type transistors may be readily conceived by those skilled in the art without creative work, and thus it is also within the protection scope of the present disclosure.

In some embodiments, the array substrate 101 has the structure as shown above, a side edge connection line 301 in the side edge structure 300 is connected to a signal connection line 201 in a corresponding fan-out structure 200, and is connected to a corresponding pixel driving sub-circuit 21 in the display area AA, so as to transmit a data signal to the pixel driving sub-circuit 21. A connection structure of the side edge connection line 301 with both the corresponding signal connection line 201 and the corresponding pixel driving sub-circuit 21 is as shown in FIG. 12.

Figure 12:
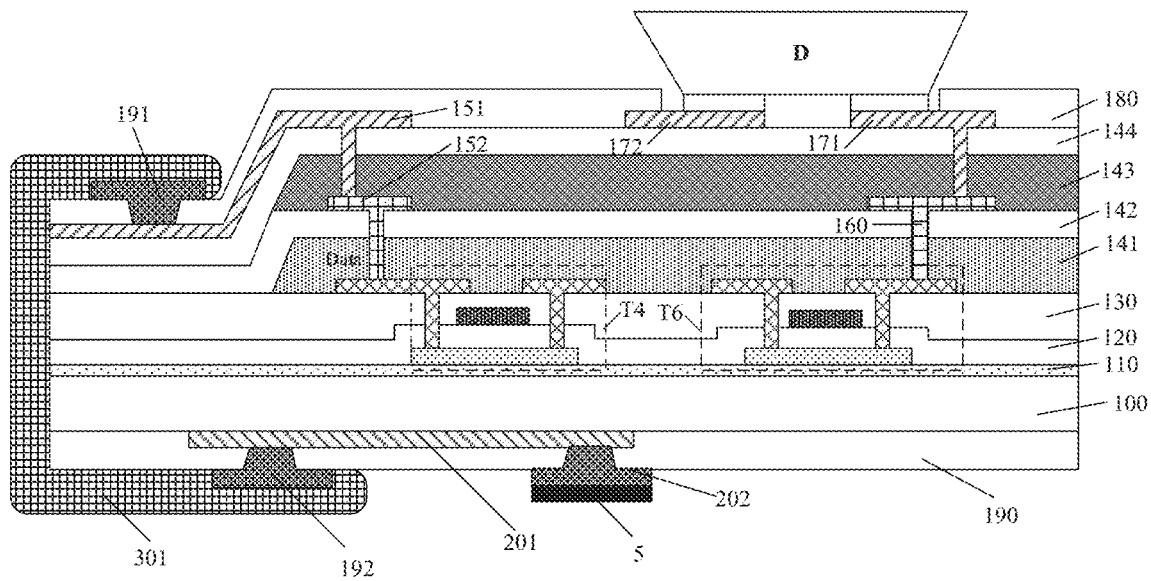
FIG. 12 is a cross-sectional view of an edge portion of yet another array substrate, in accordance with some embodiments.

FIG. 12 schematically illustrates only positional relationships of film layers of an edge portion in the array substrate 101, and is not a structural definition of the array substrate 101. In addition, FIG. 12 illustrates only a part of devices, such as the fourth transistor T4 and the sixth transistor T6, and illustration is made by taking an example in which the fourth transistor T4 and the sixth transistor T6 are top-gate thin film transistors.

As shown in FIG. 12; the array substrate 101 includes: the base 100; a buffer layer 110 disposed on the first surface S1 of the base 100; an active layer of the fourth transistor T4 and an active layer of the sixth transistor T6 that are both disposed on the buffer layer 110 and disposed in a same layer; a gate insulating layer 120 disposed on a layer where the active layer of the fourth transistor T4 and the active layer of the sixth transistor T6 are located; a gate electrode of the fourth transistor T4 and a gate electrode of the sixth transistor T6 that are both disposed on the gate insulating layer 120 and disposed in a same layer; a first insulating layer 130 disposed on a layer where the gate electrode of the fourth transistor T4 and the gate electrode of the sixth transistor T6 are located; a source electrode and a drain electrode of the fourth transistor T4; a source electrode and a drain electrode of the sixth transistor T6, and a data line Data connected to the source electrode of the fourth transistor T4 that are all disposed on the first insulating layer 130 and disposed in a same layer; a first planarization layer 141 disposed on a layer where the source electrode and the drain electrode of the fourth transistor T4, the source electrode and the drain electrode of the sixth transistor T6, and the data line Data connected to the source electrode of the fourth transistor T4 are located; a first passivation layer 142 disposed on the first planarization layer 141; a second sub-signal lead-in line 152 and a first connection electrode 160 that are both disposed on the first planarization layer 141 and disposed in a same layer, the second sub-signal lead-in line 152 being connected to the data line Data through a first via hole extending through the first planarization layer 141 and the first passivation layer 142, and the first connection electrode 160 being connected to the drain electrode of the sixth transistor T6 through a third via hole extending through the first planarization layer 141 and the first passivation layer 142; a second planarization layer 143 disposed on a layer where the second sub-signal lead-in line 152 and the first connection electrode 160 are located; a second passivation layer 144 disposed on the second planarization layer 143; a first sub-signal lead-in line 151, a first conductive pad 171 and a second conductive pad 172 that are disposed on the second passivation layer 144 and disposed in a same layer; the first sub-signal lead-in line 151 extending from the display area to the side wire bonding pin area, and being connected to the second sub-signal lead-in line 152 through a second via hole extending through the second planarization layer 143 and the second passivation layer 144, the first conductive pad 171 being connected to the first connection electrode 160 through a fourth via hole extending through the second planarization layer 143 and the second passivation layer 144; and a third passivation layer 180 disposed on the first sub-signal lead-in line 151, the first conductive pad 171 and the second conductive pad 172. The first electrode of the light-emitting device D is electrically connected to the first conductive pad 171 through a fifth via hole extending through the third passivation layer 180, and the second electrode of the light-emitting device D is electrically connected to the second conductive pad 172 through another fifth via hole extending through the third passivation layer 180. A signal connection line 201 is provided on the second surface of the base 100, a fourth passivation layer 190 is disposed on the signal connection line 201, a signal bonding terminal 202 and a second pad 192 are disposed on the fourth passivation layer 190. The second pad 192 is connected to an end of the signal connection line 201 through a sixth via hole extending through the fourth passivation layer 190, and the signal bonding terminal 202 is connected to another end of the signal connection line 201 through a seventh via hole extending through the fourth passivation layer 190. The first sub-signal lead-in line 151 is connected to a first pad 191 in the side wire bonding pin area, and the first pad 191 is connected to the second pad 192 on the second surface of the base 100 through the side connection line 301. A control integrated circuit (IC) 5 is electrically connected to the signal bonding terminal 202 disposed on the base 100 of the array substrate, and is configured to output a control signal to the signal bonding terminal 202.

The first conductive pad 171 and the second conductive pad 172 are electrically connected to two pins of the light-emitting device D, respectively. The light-emitting device D may be a micro inorganic light-emitting diode, and further, it may be a current-type light-emitting diode, such as a micro light-emitting diode (Micro-LED) or a mini light-emitting diode (Mini-LED).

Of course, in some other embodiments, the light-emitting device D may also be an organic light-emitting diode (OLED), and one of the first electrode and the second electrode of the light-emitting device D is an anode, and the other is a cathode.

Figure 13:
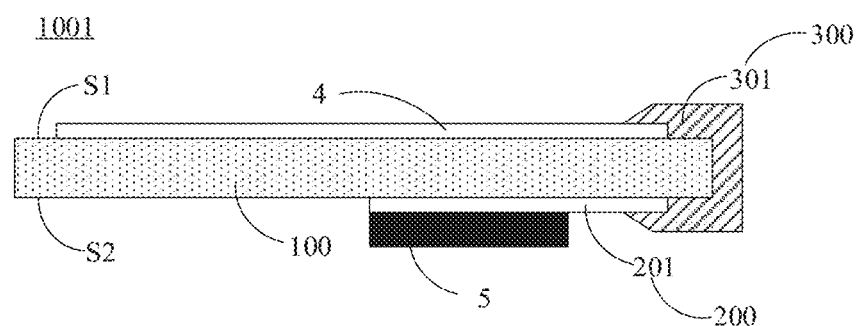
FIG. 13 is a diagram showing a structure of a display panel, in accordance with some embodiments.

Some embodiments of the present disclosure provide a display panel and a display driving method. Referring to FIG. 13, the display panel 1001 includes the array substrate 101 as described in some embodiments above. The display driving method is applied to the display panel 1001. The display driving method includes: controlling each pixel driving sub-circuit group 20 to supply pixel driving signals to two rows of sub-pixels 11 or two columns of sub-pixels 11 that are adjacent and electrically connected thereto.

Beneficial effects that may be achieved by the display panel 1001 and the display driving method provided by some embodiments of the present disclosure are the same as the beneficial effects of the array substrate 101 as described in some embodiments above, which will not be described herein again.

In some embodiments, with continued reference to FIG. 13, the display panel 1001 further includes the control integrated circuit (IC) 5. The control IC 5 is disposed on the second surface S2 of the base 100 of the array substrate 101, The control IC 5 is electrically connected to a plurality of signal connection lines 201 of corresponding fan-out structure(s) 200 in the array substrate 101, and is configured to output control signals to the plurality of signal connection lines 201.

Herein, the control signals output by the control IC 5 to the plurality of signal connection lines 201 may be transmitted into each circuit structure in the display area AA of the array substrate 101 through the side connection lines 301 in corresponding side edge structure(s) 300.

The display driving method applied to the display panel 1001 further includes: transmitting, by the control IC 5, control signals to the at least one pixel circuit group 2 and/or the shift register circuit 4 disposed on the first surface S1 of the base 100 of the array substrate 101 through the at least one side edge structure 300.

In the display panel 1001 provided by some embodiments of the present disclosure, the control IC 5 is disposed on the second surface S2 of the base 100, and the control IC 5 may output control signals on a back side of the display area AA of the array substrate 101, thereby effectively reducing the requirement of the array substrate 101 for the non-display area on the first surface S1 that is, the bezel of the array substrate 101 may be effectively reduced or even eliminated to facilitate achieving seamless splicing.

It will be understood that, in some other examples, the display panel 1001 further includes a flexible printed circuit (FPC) disposed on the second surface S2 of the base 100 of the array substrate 101. The flexible printed circuit may be electrically connected to the plurality of signal connection lines 201 of the corresponding fan-out structure 200 in the array substrate 101 through a chip on film, leads or the like, and is configured to output signals to the plurality of signal connection lines 201.

The type of the display panel 1001 is not limited in some embodiments of the present disclosure. For example, the display panel 1001 is a micro light-emitting diode (Micro-LCD) display panel or a mini light-emitting diode (Mini-LCD) display panel. Of course, the display panel 1001 may also be a liquid crystal display (LCD) panel or an organic light-emitting diode (OLED) display panel.

Figure 14:
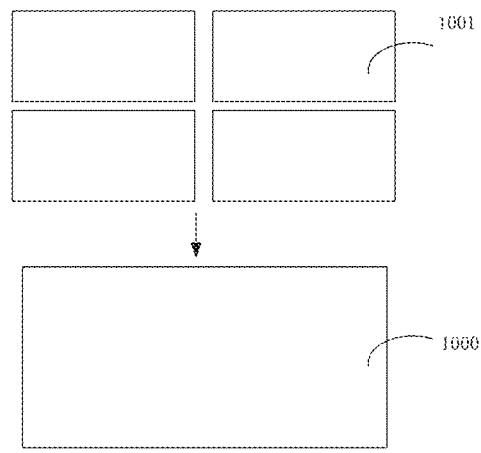
FIG. 14 is a diagram showing a structure of a spliced display panel, in accordance with some embodiments.

Some embodiments of the present disclosure provide a spliced display panel. As shown in FIG. 14, the spliced display panel 1000 includes at least two display panels 1001 as described in some embodiments above that are spliced.

For example, as shown in FIG. 14, the spliced display panel is formed by seamlessly splicing four display panels 1001. There is no splicing gap in a display image of the spliced display panel, or the splicing gap is too small to be observed. The spliced display panel may have a large-sized display screen and excellent display image quality.

Display panels in the spliced display panel in some embodiments of the present disclosure are the same as the display panel in some embodiments described above, and the beneficial effects that may be achieved will not be described herein again.

In descriptions of the above embodiments, specific features, structures, materials or characteristics may be combined in any suitable manner in any one or more embodiments or examples.

The foregoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims,

What is claimed is:

1. An array substrate, having a display area, the array substrate comprising:
M pixel lines disposed in the display area and arranged in a first direction, M being an integer greater than or equal to 2; and
N pixel circuit groups arranged in the first direction, N being a positive integer less than M; wherein
a pixel circuit group of the N pixel circuit groups is electrically connected to adjacent two pixel lines of the M pixel lines, and the first direction is one of a row direction and a column direction.

2. The array substrate according to claim 1, wherein a single pixel circuit group of the N pixel circuit groups is disposed between a (2i−1)-th pixel line of the M pixel lines and a 2i-th pixel line of the M pixel lines, and no pixel circuit group is disposed between the 2i-th pixel line and a (2i+1)-th pixel line of the M pixel lines; and i is a positive integer.

3. The array substrate according to claim 2, wherein each of the N pixel circuit groups includes a pixel driving sub-circuit group, and the pixel driving sub-circuit group includes pixel driving sub-circuits that are arranged in a p×q array;
each of the M pixel lines includes p pixels sequentially arranged in a second direction, and each of the p pixels includes $$\frac{q}{2}$$

sub-pixels; the second direction is another of the row direction and the column direction; p and q are each a positive integer; and
a pixel driving sub-circuit is electrically connected to a sub-pixel.

4. The array substrate according to claim 3, wherein each of the N pixel circuit groups further includes at least one functional sub-circuit disposed on at least one side of the pixel driving sub-circuit group in the second direction, and the functional sub-circuit includes a data selection circuit, an electrostatic discharge protection circuit or a side wire bonding pin area.

5. The array substrate according to claim 4, wherein the electrostatic discharge protection circuit and the side wire bonding pin area are arranged in a ring along an edge of the display area.

6. The array substrate according to claim 3, further comprising at least one shift register circuit disposed between a j-th pixel line of the M pixel lines and one of a (j−1)-th pixel line and a (j+1)-th pixel line of the M pixel lines, j being a rounded value of $$\frac{M}{2},$$

wherein no pixel driving sub-circuit group is disposed between the j-th pixel line and the one of the (j−1)-th pixel line and the (j+1)-th pixel line; and
the at least one shift register circuit is electrically connected to each pixel driving sub-circuit group in the N pixel circuit groups, and is configured to supply scan driving signals to each pixel driving sub-circuit group in the N pixel circuit groups.

7. The array substrate according to claim 6, wherein each of the N pixel circuit groups further includes at least one functional sub-circuit disposed on at least one side of the shift register circuit in the second direction, and the functional sub-circuit includes a data selection circuit, an electrostatic discharge protection circuit or a side wire bonding pin area.

8. The array substrate according to claim 3, further comprising at least one shift register circuit, wherein each shift register circuit is disposed between two pixel lines that are different from two pixel lines between which a pixel driving sub-circuit group is disposed;
the at least one shift register circuit includes a first shift register circuit and a second shift register circuit; and
the first shift register circuit and the second shift register circuit are electrically connected to a plurality of pixel driving sub-circuit groups in the N pixel circuit groups; or the first shift register circuit is electrically connected to some of the plurality of pixel driving sub-circuit groups, and the second shift register circuit is electrically connected to some other pixel driving sub-circuit groups of the plurality of pixel driving sub-circuit groups.

9. The array substrate according to claim 8, wherein the first shift register circuit and the second shift register circuit are arranged adjacently between two pixel lines; or
the first shift register circuit is disposed between two pixel lines that are different from two pixel lines between which the second shift register circuit is disposed.

10. The array substrate according to claim 8, wherein the at least one shift register circuit further includes:
a first backup circuit, the first backup circuit being a backup of the first shift register circuit, and being configured to be electrically connected to corresponding pixel driving sub-circuit groups when the first shift register circuit fails, and to supply scan driving signals to its corresponding pixel driving sub-circuit groups; and a second backup circuit, the second backup circuit being a backup of the second shift register circuit, and being configured to be electrically connected to corresponding pixel driving sub-circuit groups when the second shift register circuit fails, and to supply scan driving signals to its corresponding pixel driving sub-circuit groups.

11. The array substrate according to claim 10, wherein the first backup circuit and the first shift register circuit are disposed between same two pixel lines; and the second backup circuit and the second shift register circuit are disposed between same two pixel lines.

12. The array substrate according to claim 10, wherein the first backup circuit and the first shift register circuit are located in different film layers, and the second backup circuit and the second shift register circuit are located in different film layers.

13. The array substrate according to claim 4, further comprising:

a base, the base including a first surface and a second surface opposite to the first surface, and the M pixel lines and the N pixel circuit groups being disposed on the first surface;

at least one fan-out structure, wherein the at least one fan-out structure is disposed on the second surface, each fan-out structure includes a plurality of signal connection lines, and the plurality of signal connection lines extend from an edge of the second surface to a non-edge area of the second surface; and at least one side edge structure, each side edge structure including a plurality of side edge connection lines, wherein one end of each of the plurality of side edge connection lines is electrically connected to a signal connection line of a corresponding fan-out structure, and another end of the each of the plurality of side edge connection lines is connected to a corresponding functional sub-circuit.

14. The array substrate according to claim 4, further comprising:

a base, the base including a first surface and a second surface opposite to the first surface, and the M pixel lines and the N pixel circuit groups being disposed on the first surface;

at least one fan-out structure, wherein the at least one fan-out structure is disposed on the second surface, each fan-out structure includes a plurality of signal connection lines, and the plurality of signal connection lines extend from an edge of the second surface to a non-edge area of the second surface;

at least one side edge structure, each side edge structure including a plurality of side edge connection lines; and at least one shift register circuit disposed on the first surface, wherein one end of each side edge connection line of the plurality of side edge connection lines is electrically connected to a signal connection line in a corresponding fan-out structure, and another end of the side edge connection line is connected to a corresponding functional sub-circuit or a corresponding shift register circuit.

15. A display panel, comprising the array substrate according to claim 1.

16. The display panel according to claim 15, further comprising a control integrated circuit, wherein the control integrated circuit is disposed on a second surface of a base of the array substrate, and the control integrated circuit is electrically connected to a plurality of signal connection lines in a corresponding fan-out structure of the array substrate, and is configured to output control signals to the plurality of signal connection lines.

17. The display panel according to claim 16, wherein the plurality of signal connection lines are electrically connected to a signal bonding terminal in the corresponding fan-out structure, and the signal bonding terminal is bonded to the control integrated circuit.

18. A spliced display panel, comprising at least two display panels according to claim 15 that are spliced to each other.

19. A display driving method, applied to the display panel according to claim 15, the display driving method comprising:

controlling each pixel driving sub-circuit group in the N pixel circuit groups to supply pixel driving signals to two adjacent rows of sub-pixels or two adjacent columns of sub-pixels that are electrically connected to the pixel driving sub-circuit group.

20. The display driving method according to claim 19, further comprising:

transmitting, by a control integrated circuit disposed on a second surface of a base of the array substrate, control signals to the N pixel circuit groups and/or a shift register circuit disposed on a first surface of the base of the array substrate through at least one side edge structure.

* * * * *